United States Patent [19]

Jones

[11] Patent Number: 4,943,720
[45] Date of Patent: Jul. 24, 1990

[54] ELECTRONIC PROBE

[76] Inventor: Barbara L. Jones, 80 Chisbury Place, Forest Park, Bracknell RG 123 TX, England

[21] Appl. No.: 389,056

[22] Filed: Aug. 2, 1989

[30] Foreign Application Priority Data

Aug. 3, 1988 [GB] United Kingdom ............... 8818445

[51] Int. Cl.⁵ ............................................. H02J 37/26
[52] U.S. Cl. ................................. 250/306; 324/158 P
[58] Field of Search ............................. 250/306, 307; 324/158 P

[56] References Cited

U.S. PATENT DOCUMENTS 4,668,865  5/1987  Gimzewski et al. ............... 250/306
4,873,115 10/1989  Matsumara et al. .................. 427/34

Primary Examiner—Jack I. Berman
Attorney, Agent, or Firm—Scully, Scott, Murphy & Presser

[57] ABSTRACT

An electronic probe consists of a steel elongate base (10) having a conical tip (12) and a thin layer (14) of semiconducting diamond of the tip (12). The diamond tip (16), viewed end-on, will generally have a radius of less than 3000 angstroms.

8 Claims, 1 Drawing Sheet

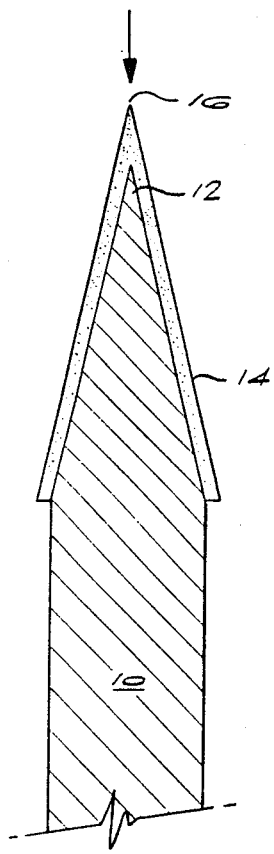
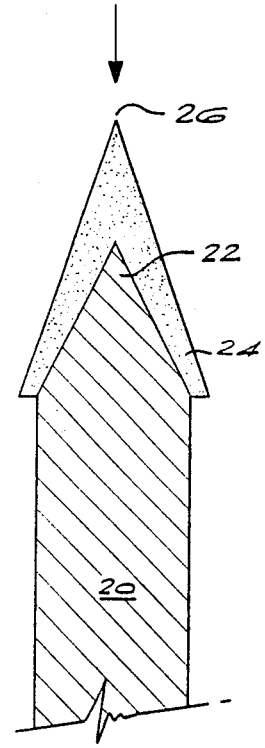
Fig. 1
Fig. 2

ELECTRONIC PROBE

BACKGROUND OF THE INVENTION

This invention relates to an electronic probe.

The Scanning Tunnelling Microscope (STM) is an instrument capable of mapping electronic states at the surface of a specimen with atomic scale resolution. By selectively imaging the tunnelling current from specific electronic states both chemical and physical information may be obtained in addition to the arrangements of atoms within the surface structure. The STM uses a tunnelling junction consisting of a conducting surface and a tip electrode or probe.

SUMMARY OF THE INVENTION

According to the present invention, there is provided an electronic probe comprising an electrically conductive base and a fine pointed tip, made of a semi-conducting diamond material, in electrical contact with the base.

DESCRIPTION OF THE DRAWINGS

FIGS. 1 and 2 are sectional side views of two embodiments of an electronic STM probe of the invention.

DETAILED DESCRIPTION OF THE INVENTION

The invention relates to electronic probes such as STM probes, field ion microscopy probes and electronic probes for integrated circuit (IC) testing.

The base is preferably an elongate object having a pointed end and the semi-conducting diamond material is provided as a thin layer on the pointed end. The layer will generally have a thickness of no more than 5 microns.

The tip of semi-conducting diamond material will be fine, typically having a radius, viewed end-on, of less than 3000 angstroms.

The diamond material may be a diamond-like material produced by many chemical vapour deposition methods, but is preferably single- or poly-crystalline diamond. The semi-conducting diamond will preferably be boron-doped diamond.

The base may be made of any suitable electrically conductive material, and is preferably made of steel or boron-doped silicon.

The deposition of the semi-conducting diamond material on the base is achieved using chemical vapour deposition (CVD). Chemical vapour deposition is a known method of growing diamond or a diamond-like material on a substrate and involves creating an atmosphere of a gaseous carbon compound around the base, and subjecting the gaseous compound to suitable energy to cause the compound to decompose and deposit carbon, as diamond, on the base. The atmosphere of gaseous carbon compound will also contain atoms such as boron, phosphorus or like atom which will dope the deposited diamond layer producing a semi-conducting diamond layer. The gaseous carbon compound may be decomposed by use of various energies including heat, radio frequency energy, microwave energy or a combination thereof.

The preferred CVD method of growing the diamond tip on the base is that described and claimed in EPA 89304200-2. This method includes the steps of placing the base on a nitride surface, creating an atmosphere of a gaseous carbon compound and atoms of boron, phosphorus or the like around the base, bringing the temperature of the nitride surface and the base to at least 600° C., and subjecting the gaseous carbon compound to microwave energy suitable to cause the compound to decompose and produce carbon which deposits together with atoms of boron, plosphorus or the like on the base and forms crystalline semi-conducting diamond thereon. The nitride is typically silicon nitride, aluminium nitride, titanium nitride, or the like. Generally the nitride surface and the base will be maintained at a temperature of 600° to 1000° C. during the time when the decomposition of the carbon compound and the deposition of the carbon on the base takes place. The microwave energy will be generally in the range 200 MHz to 90 GHz.

The gaseous carbon compound will generally be a hydrocarbon compound such as methane. The source of the other atoms in the atmosphere may be hydrogen, diborane and similar such atmospheres.

The method of this European patent application allows thin layers of crystalline diamond to be produced on the base. Generally the pointed tip of an elongate base as described above will be exposed to the diamond growth so that a thin layer of diamond is produced thereon.

The attached drawing illustrates two embodiments of the invention. Referring to FIG. 1, the STM probe consists of an elongate steel body 10 having a fine conical tip 12 at one end thereof. A thin layer 14 of boron-doped diamond is deposited on the tip to provide the probe with a fine diamond tip 16. The layer 14 has a thickness of about 0,1 microns and the tip 16, viewed end-on in the direction of the arrow, has a radius of less than 3000 angstroms. FIG. 2 illustrates a second embodiment in which there is again provided an elongate steel body 20. The steel body has a less sharp conical tip 22 on which is deposited a layer 24 of boron-doped diamond. The diamond layer provides the probe with a fine tip 26. The layer 24 is thicker than the layer 14 of the FIG. 1 embodiment and is physiochemically etched to provide the fine point. The tip 26 has the same radius, viewed end on in the direction of the arrow, as the tip 16.

The boron-doped diamond layers 14, 24 may be deposited on the steel tips using the method described and claimed in the above-mentioned European application. In particular, these layers may be produced by placing the elongate steel body on a silicon nitride surface, creating an atmosphere of a gaseous compound such as methane around the body, introducing boron atoms into the atmosphere, bringing the temperature of the nitride surface and the body to a temperature of the order of 700° to 800° C., subjecting the gaseous methane to microwave energy of the order of 2,45 GHz and maintaining these conditions for a period of about 2 hours. The methane decomposes and produces carbon which, together with the boron atoms, deposit on the conical tip of the steel body to form crystalline boron doped diamond thereon.

If the diamond tip produced in this manner is not sufficiently fine, the diamond may be polished to produce a tip of the desired fineness.

I claim:

1. An electronic probe comprising an electrically conductive base and a fine pointed tip, made of a semi-conducting diamond material, in electrical contact with the base.

2. A probe according to claim 1 wherein the base is an elongate object having a pointed end and the diamond material forms a thin layer on the pointed end.

3. A probe according to claim 2 wherein the thin layer has a thickness of less than 5 microns.

4. A probe according to claim 1 wherein the tip has a radius, viewed end on, of less than 3000 angstroms.

5. A probe according to claim 1 wherein the diamond material is crystalline diamond.

6. A probe according to claim 1 wherein the semiconducting diamond material is boron-doped diamond.

7. A probe according to claim 1 wherein the base is made of steel.

8. A probe according to claim 1 wherein the base is made of boron-doped silicon.

* * * * *